US012729428B2

(12) United States Patent
So et al.

(10) Patent No.: US 12,729,428 B2
(45) Date of Patent: Sep. 8, 2026

(54) SUBSTRATE TREATMENT METHOD

(71) Applicant: JUSUNG ENGINEERING CO., LTD., Gwangju-si (KR)

(72) Inventors: Jae Wuk So, Gwangju-si (KR); Chang Kyun Park, Gwangju-si (KR); Hong Min Yoon, Gwangju-si (KR); Joo Sung Kim, Gwangju-si (KR); Chul Joo Hwang, Gwangju-si (KR)

(73) Assignee: JUSUNG ENGINEERING CO., LTD. (KR)

( * ) Notice: Subject to any disclaimer, the term of this patent is extended or adjusted under 35 U.S.C. 154(b) by 42 days.

(21) Appl. No.: 18/833,367

(22) PCT Filed: Feb. 20, 2023

(86) PCT No.: PCT/KR2023/002375

§ 371 (c)(1),
(2) Date: Jul. 25, 2024

(87) PCT Pub. No.: WO2023/163466

PCT Pub. Date: Aug. 31, 2023

(65) Prior Publication Data

US 2025/0109489 A1 Apr. 3, 2025

(30) Foreign Application Priority Data

Feb. 24, 2022 (KR) ........................ 10-2022-0024012

(51) Int. Cl.
*C23C 16/04* (2006.01)
*C23C 16/34* (2006.01)

(52) U.S. Cl.
CPC ............ *C23C 16/04* (2013.01); *C23C 16/345* (2013.01)

(58) Field of Classification Search
None
See application file for complete search history.

(56) References Cited

U.S. PATENT DOCUMENTS

2017/0175266 A1* 6/2017 Kumagai ................ C23C 16/46
2018/0233350 A1* 8/2018 Tois .................. H01L 21/76829
(Continued)

FOREIGN PATENT DOCUMENTS

KR 20120085834 A 8/2012
KR 20200019271 A 2/2020
(Continued)

OTHER PUBLICATIONS

International Search Report for PCT/KR2023/002375 mailed Jun. 5, 2023.

*Primary Examiner* — Mandy C Louie
(74) *Attorney, Agent, or Firm* — Renaissance IP Law Group LLP

(57) ABSTRACT

The present inventive concept relates to a method for treatment of a substrate having an insulating layer and an electrode layer formed thereon, the method comprising: a plasma treatment step of treating the substrate with plasma by using treatment gas containing fluorine (F); a selective adsorption step of spraying the substrate, subjected to the plasma treatment step, with source gas containing a high-k material to adsorb the high-k material only on the electrode layer; and a selective deposition step of spraying the substrate, subjected to the selective adsorption step, with reaction gas to deposit a high-k layer only on the electrode layer.

17 Claims, 3 Drawing Sheets

(56) References Cited

U.S. PATENT DOCUMENTS

2021/0040130 A1* 2/2021 Lee ...................... H10D 64/691
2021/0398846 A1 12/2021 Tapily et al.

FOREIGN PATENT DOCUMENTS

KR 20200051600 A 5/2020
KR 20200079343 A 7/2020
WO 2018195423 A1 10/2018

* cited by examiner

SUBSTRATE TREATMENT METHOD

TECHNICAL FIELD

The present inventive concept relates to a method of processing a substrate, which performs a processing process such as a deposition process on a substrate.

BACKGROUND ART

Generally, a thin-film layer, a thin-film circuit pattern, or an optical pattern should be formed on a substrate for manufacturing a semiconductor device, a display device, a solar cell, etc. To this end, a processing process is performed on a substrate, and examples of the processing process include a deposition process of depositing a thin film including a specific material on the substrate, a photo process of selectively exposing a portion of a thin film by using a photosensitive material, an etching process of removing the selectively exposed portion of the thin film to form a pattern, etc. Through such a processing process on a substrate, a thin film may be manufactured on the substrate.

Here, in a case where a third thin film layer is formed on only a first thin film layer of the first thin film layer and a second thin film layer formed on a substrate, a method of processing a substrate according to the related art performs a deposition process of forming the third thin film layer all over the first thin film layer and the second thin film layer and then repeatedly performs an etching process of etching only a portion of the third thin film layer formed on the second thin film layer, and thus, the third thin film layer is formed on only the first thin film layer.

Therefore, the method of processing a substrate according to the related art has a problem where process efficiency is reduced in a case where an additional thin film layer is selectively formed on only some thin film layers among a plurality of thin film layers formed on the substrate. Recently, as semiconductor devices, display apparatuses, and solar cells are more miniaturized and are also developed to have a thinner thickness, such a problem has been severer.

DISCLOSURE

Technical Problem

The present inventive concept is devised to solve the above-described problem and is for providing a substrate processing method which may enhance the efficiency of a process of selectively forming an additional thin film layer on only some thin film layers among a plurality of thin film layers formed on a substrate.

Technical Solution

To accomplish the above-described objects, the present inventive concept may include the following elements.

A substrate processing method according to the present inventive concept may be a method of processing a substrate where an insulation layer and an electrode layer are formed and may include: a plasma treatment step of performing plasma treatment on the substrate by using a processing gas including fluorine (F); a selective adsorption step of injecting a source gas including a high-k dielectric material onto a substrate on which the plasma treatment step has been performed; and a selective deposition step of injecting a reactant gas onto a substrate, on which the selective adsorption step has been performed, to deposit a high-k dielectric layer onto only the electrode layer.

Advantageous Effect

According to the present inventive concept, the following effects may be realized.

The present inventive concept is implemented so that a high-k dielectric layer is prevented from being formed on an insulation layer, based on plasma treatment performed on a substrate on which the insulation layer and an electrode layer are formed, and thus, the high-k dielectric layer is formed on only the electrode layer even without an etching process of removing the high-k dielectric layer from the insulation layer. Accordingly, the present inventive concept may enhance the efficiency of a process of forming a high-k dielectric layer on only an electrode layer among an insulation layer and the electrode layer.

The present inventive concept may omit an etching process of removing a high-k dielectric layer from an insulation layer, and thus, may reduce a process time to increase the productivity of a substrate where the high-k dielectric layer is formed on only the electrode layer.

MODE FOR INVENTIVE CONCEPT

Hereinafter, an embodiment of a method of processing a substrate according to the present inventive concept will be described in detail with reference to the accompanying drawings.

In describing an embodiment of the present inventive concept, when an arbitrary structure is described as being formed “on” or “under” another structure, this description should be construed as including a case, where a third structure is disposed between the structures, as well as a case where the structures contact each other.

Figure 1:
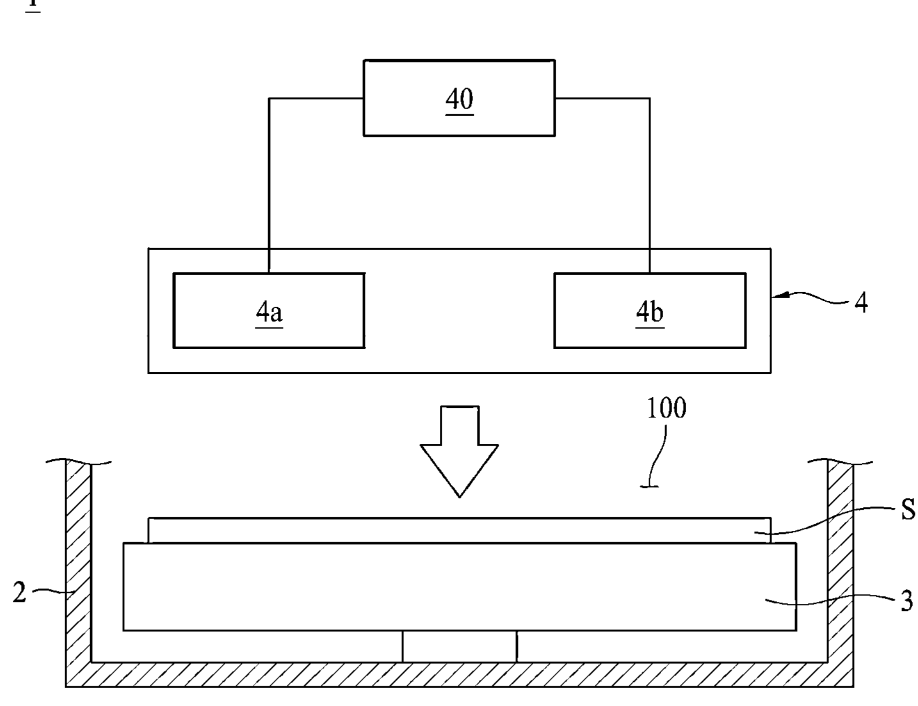
FIG. 1 is a schematic configuration diagram illustrating an example of a substrate processing apparatus for performing a method of processing a substrate, according to the present inventive concept.
Figure 2:
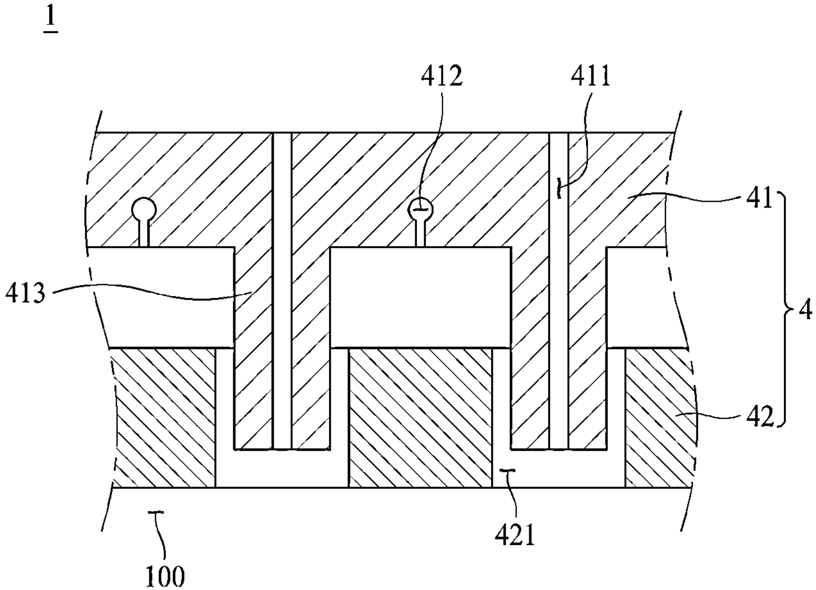
FIGS. 2 and 3 are schematic side cross-sectional views of an injection unit injecting a gas in an example of a substrate processing apparatus for performing a method of processing a substrate, according to the present inventive concept.
Figure 3:
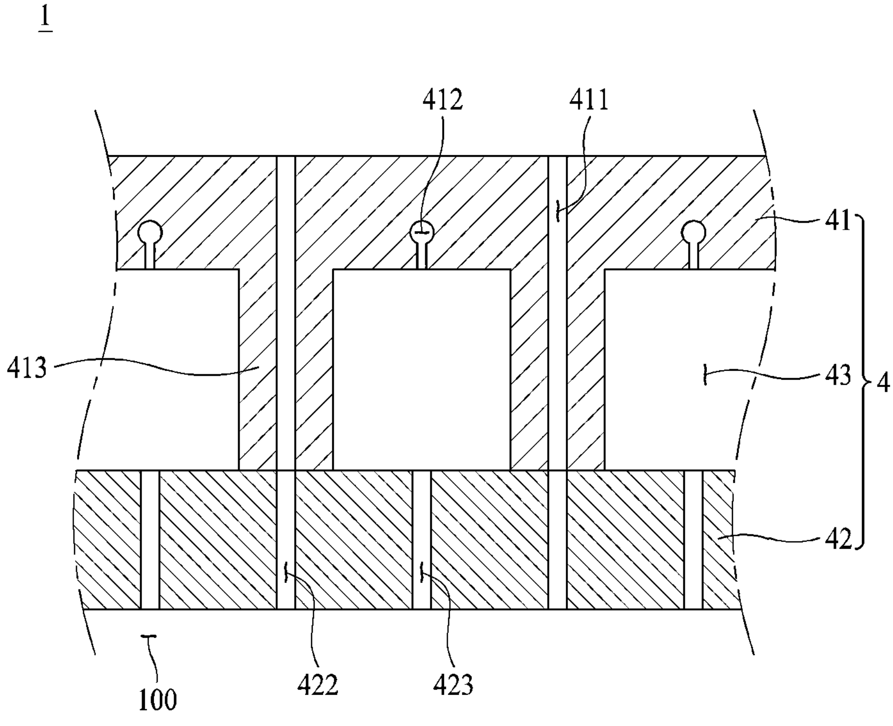
Figure 4:
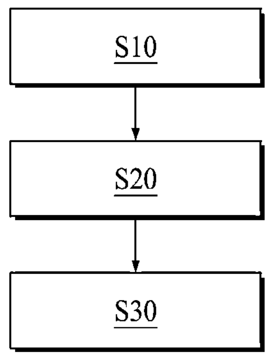
FIGS. 4 and 5 are schematic flowcharts of a method of processing a substrate, according to the present inventive concept.
Figure 5:
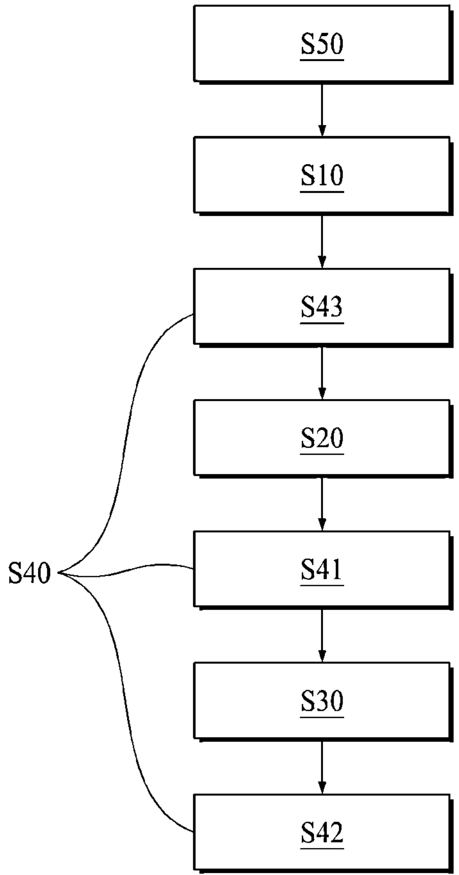

Referring to FIGS. 1 to 3, a substrate processing method according to the present inventive concept performs a processing process on a substrate S. The substrate S may be a silicon substrate, a glass substrate, a metal substrate, or the like. An insulation layer and an electrode layer are formed on the substrate S. In this case, the substrate processing method according to the present inventive concept may perform a processing process on the substrate S where the insulation layer and the electrode layer are formed. For example, the insulation layer may be manufactured by using silicon nitride (SiN), and the electrode layer may be manufactured by using titanium nitride (TiN).

The substrate processing method according to the present inventive concept may be performed by using a substrate processing apparatus 1. Before describing an embodiment of the substrate processing method according to the present inventive concept, the substrate processing apparatus 1 will be described below in detail.

Referring to FIGS. 1 to 3, the substrate processing apparatus 1 may include a chamber 2, a substrate supporting unit 3, and an injection unit 4.

The chamber 2 provides a processing space 100. A processing process on the substrate S may be performed in the processing space 100. The processing space 100 may be disposed in the chamber 2. An exhaust port (not shown) which exhausts a gas from the processing space 100 may be coupled to the chamber 2. The substrate supporting unit 3 and the injection unit 4 may be disposed in the chamber 2.

The substrate supporting unit 3 supports the substrate S. The substrate supporting unit 3 may support one substrate S, or may support a plurality of substrates S. In a case where the plurality of substrates S are supported by the substrate supporting unit 3, a process of manufacturing a thin film on each of the substrates S may be performed. The substrate supporting unit 3 may be coupled to the chamber 2. The substrate supporting unit 3 may be disposed in the chamber 2.

The injection unit 4 injects a gas toward the substrate supporting unit 3. The injection unit 4 may be connected with a gas storage unit 40. In this case, the injection unit 4 may inject a gas, supplied from the gas storage unit 40, toward the substrate supporting unit 3. The injection unit 4 may be disposed in the chamber 2. The injection unit 4 may be disposed to be opposite to the substrate supporting unit 3. The injection unit 4 may be disposed over the substrate supporting unit 3. The processing space 100 may be disposed between the injection unit 4 and the substrate supporting unit 3. The injection unit 4 may be coupled to a lid (not shown). The lid may be coupled to the chamber 2 to cover an upper portion of the chamber 2.

The injection unit 4 may include a first gas flow path **4*a* and a second gas flow path 4*b***.

The first gas flow path **4*a* is for injecting a first gas. One side of the first gas flow path 4*a* may be connected with the gas storage unit 40 through a pipe, a hose, or the like. The other side of the first gas flow path 4*a* may communicate with the processing space 100. Accordingly, the first gas supplied from the gas storage unit 40 may flow along the first gas flow path 4*a*, and then, may be injected into the processing space 100 through the first gas flow path 4*a*. The first gas flow path 4*a* may function as a flow path for enabling the first gas to flow and may function as an injection port for injecting the first gas into the processing space 100**.

The second gas flow path **4*b* is for injecting a second gas. The second gas and the first gas may be different gases. For example, when the first gas is a source gas, the second gas may be a reactant gas. One side of the second gas flow path 4*b* may be connected with the gas storage unit 40 through a pipe, a hose, or the like. The other side of the second gas flow path 4*b* may communicate with the processing space 100. Accordingly, the second gas supplied from the gas storage unit 40 may flow along the second gas flow path 4*b*, and then, may be injected into the processing space 100 through the second gas flow path 4*b*. The second gas flow path 4*b* may function as a flow path for enabling the second gas to flow and may function as an injection port for injecting the second gas into the processing space 100**.

The second gas flow path **4*b* and the first gas flow path 4*a* may be disposed to be spatially separated from each other. Therefore, the second gas supplied from the gas storage unit 40 to the second gas flow path 4*b* may be injected into the processing space 100 without passing through the first gas flow path 4*a*. The first gas supplied from the gas storage unit 40 to the second gas flow path 4*b* may be injected into the processing space 100 without passing through the second gas flow path 4*b*. The second gas flow path 4*b* and the first gas flow path 4*a* may inject a gas toward different portions of the processing space 100**.

For example, as illustrated in FIG. 2, the injection unit 4 may include a first plate 41 and a second plate 42.

The first plate 41 is disposed over the second plate 42. The first plate 41 and the second plate 42 may be disposed apart from each other. A plurality of first gas holes 411 may be formed in the first plate 41. Each of the first gas holes 411 may function as a path for enabling the first gas to flow. The first gas holes 411 may be included in the first gas flow path **4*a*. A plurality of second gas holes 412 may be formed in the second plate 42. Each of the second gas holes 412 may function as a path for enabling a gas to flow. The second gas holes 412 may be included in the second gas flow path 4*b*. A plurality of protrusion members 413 may be coupled to the first plate 41. The protrusion members 413 may protrude toward the second plate 42 from a lower surface of the first plate 41. Each of the first gas holes 411 may be formed to pass through the first plate 41 and the protrusion member 413**.

A plurality of openings 421 may be formed in the second plate 42. The openings 421 may be formed to pass through the second plate 42. The openings 421 may be disposed at a position corresponding to each of the protrusion members 413. Therefore, as illustrated in FIG. 2, the protrusion members 413 may be formed by a length which enables the protrusion members 413 to be respectively inserted into the openings 421. Although not shown, the protrusion members 413 may be formed by a length which enables the protrusion members 413 to be respectively disposed over the openings 421. The protrusion members 413 may be formed by a length which protrudes downward from the second plate 42. The second gas holes 412 may be disposed to inject a gas toward an upper surface of the second plate 42.

The injection unit 4 may generate plasma by using the second plate 42 and the first plate 41. In this case, a plasma power such as radio frequency (RF) power may be applied to the first plate 41, and the second plate 42 may be grounded. The first plate 41 may be grounded, and the plasma power may be applied to the second plate 42.

As illustrated in FIG. 3, a plurality of first openings 422 and a plurality of second openings 423 may be formed in the second plate 42.

The first openings 422 may be formed to pass through the second plate 42. The first openings 422 may be respectively connected with the first gas holes 411. In this case, the protrusion members 413 may be disposed to contact an upper surface of the second plate 42. The first gas may be injected into the processing space 100 via the first gas holes 411 and the first openings 422. The first gas holes 411 and the first openings 422 may be included in the first gas flow path **4*a***.

The second openings 423 may be formed to pass through the second plate 42. The second openings 423 may be connected with a buffer space 43 disposed between the first plate 41 and the second plate 42. The second gas may be injected into the processing space 100 via the second gas holes 412, the buffer space 43, and the second openings 423. The second gas holes 412, the buffer space 43, and the second openings 423 may be included in the second gas flow path **4*b***.

The method of processing a substrate according to the present inventive concept may be performed by using the substrate processing apparatus 1 described above. Although not shown, the method of processing a substrate according to the present inventive concept may be performed by using a substrate processing system where the substrate processing apparatus 1 is provided in plurality. In this case, at least one of the substrate processing apparatuses 1 may perform surface treatment by using an oxide elimination chamber (OEC). At least one of the substrate processing apparatuses 1 may perform in-cycle plasma treatment using inductively coupled plasma (ICP). At least one of the substrate processing apparatuses 1 may perform a deposition process based on an atomic layer deposition (ALD) and a chemical vapor deposition (CVD). The substrate processing system may be implemented as a cluster type where the substrate processing apparatuses 1 are arranged along a perimeter of a transfer chamber. The substrate processing system may be implemented as an in-line type where the substrate processing apparatuses 1 are arranged in a length direction of the transfer chamber. The substrate processing system may be implemented as a hybrid type where the substrate processing apparatuses 1 are arranged along a perimeter of each of the transfer chambers.

Referring to FIGS. 1 to 4, the method of processing a substrate according to the present inventive concept may perform a processing process on the substrate S where the insulation layer and the electrode layer are formed, and thus, may deposit a high-k dielectric layer, formed of a high-k dielectric material, on only the electrode layer. To this end, the method of processing a substrate according to the present inventive concept may include a plasma treatment step S10, a selective adsorption step S20, and a selective deposition step S30.

Referring to FIGS. 1 to 4, the plasma treatment step S10 performs plasma treatment on the substrate S by using a processing gas including fluorine (F). The plasma treatment step S10 may allow the high-k dielectric material not to be adsorbed onto the insulation layer, through the plasma treatment. The plasma treatment step S10 may decrease an adsorption rate of the high-k dielectric material on the insulation layer, through the plasma treatment.

As described above, the method of processing a substrate according to the present inventive concept is implemented so that the high-k dielectric layer is prevented from being formed on the insulation layer, based on plasma treatment, and thus, the high-k dielectric layer is formed on only the electrode layer even without an etching process of removing the high-k dielectric layer from the insulation layer. Accordingly, the method of processing a substrate according to the present inventive concept may enhance the efficiency of a process of forming the high-k dielectric layer on only the electrode layer among the insulation layer and the electrode layer. Also, the method of processing a substrate according to the present inventive concept may omit an etching process of removing the high-k dielectric layer from the insulation layer, and thus, may reduce a process time to increase the productivity of the substrate S where the high-k dielectric layer is formed on only the electrode layer.

In a case where the insulation layer manufactured by using silicon nitride (SiN) and the electrode layer manufactured by using titanium nitride (TiN) are formed on the substrate S, the plasma treatment step S10 may perform plasma treatment by using a processing gas including sulfur hexafluoride ($SF_6$). Therefore, the plasma treatment step S10 may allow the high-k dielectric material not to be adsorbed onto the insulation layer. In this case, the plasma treatment step S10 may perform plasma treatment on the substrate S by using a processing gas including sulfur hexafluoride ($SF_6$), and thus, may form a blocking layer, blocking the adsorption of the high-k dielectric material, on the insulation layer. The blocking layer may be formed of a Si—F thin film, including silicon (Si) and fluorine (F), on the insulation layer, and thus, may block the adsorption of the high-k dielectric material. Furthermore, it has been described that the insulation layer is manufactured by using silicon nitride (SiN), but the present inventive concept is not limited thereto and the insulation layer may be manufactured with a different material other than nitrogen (N) if a material such as silicon (Si) is higher in reactivity on fluorine (F) than a material included in the electrode layer.

The plasma treatment step S10 may form the blocking layer on only the insulation layer through the plasma treatment and may allow the blocking layer not to be formed on the electrode layer. In this case, a material included in the electrode layer may be lower in reactivity on fluorine (F) than a material included in the insulation layer. Also, the material included in the electrode layer may be higher in reactivity on the high-k dielectric material than fluorine (F).

The plasma treatment step S10 may perform plasma treatment on the substrate S through ICP discharge. In this case, the plasma treatment step S10 may be performed by the substrate processing apparatus 1, which performs in-cycle plasma treatment using ICP, of the substrate processing apparatuses 1 included in the substrate processing system.

Referring to FIGS. 1 to 4, the selective adsorption step S20 injects a source gas including the high-k dielectric material onto the substrate S on which the plasma treatment step S10 is performed. The high-k dielectric layer may be prevented from being formed on the insulation layer through the plasma treatment step S10, and thus, the selective adsorption step S20 may adsorb the high-k dielectric material onto only the electrode layer. That is, the selective adsorption step S20 may adsorb the high-k dielectric material on only the electrode layer by using a selectivity. Accordingly, the method of processing a substrate according to the present inventive concept may enhance the efficiency of a process of forming the high-k dielectric layer on only the electrode layer.

The selective adsorption step S20 may be performed by injecting a source gas including niobium oxide. In this case, niobium (Nb) may correspond to the high-k dielectric material. Niobium (Nb) included in the source gas may not be adsorbed onto the insulation layer by fluorine (F) which is on only the insulation layer and may be adsorbed onto only the electrode layer. The selective adsorption step S20 may inject a source gas including niobium monoxide (NbO). The selective adsorption step S20 may inject a source gas including niobium oxide consisting of NbxOy in addition to niobium monoxide (NbO). Here, x and y may each be an integer which is greater than 0, may be the same values, or may be different values.

The selective adsorption step S20 may be performed by injecting the source gas including the high-k dielectric material onto the substrate S through the first gas flow path **4*a* included in the injection unit 4. In the injection unit 4 illustrated in FIG. 2, the source gas including the high-k dielectric material may be injected onto the substrate S via the first gas holes 411 and the openings 421. In the injection unit 4 illustrated in FIG. 3, the source gas including the high-k dielectric material may be injected onto the substrate S via the first gas holes 411 and the first openings 422**.

The selective adsorption step S20 may be implemented so that niobium (Nb) is more smoothly adsorbed onto only the electrode layer by controlling an injection time for which the source gas including niobium oxide is injected. In this case, the selective adsorption step S20 may inject the source gas including niobium oxide for an injection time which is longer than a first adsorption time for which niobium (Nb) is adsorbed onto the electrode layer and is shorter than a second adsorption time for which niobium (Nb) is adsorbed onto the insulation layer. Accordingly, the selective adsorption step S20 may control an injection time of the source gas including niobium oxide, and thus, may allow niobium (Nb) not to be adsorbed onto the insulation layer and simultaneously may allow niobium (Nb) onto the electrode layer. Accordingly, the method of processing a substrate according to the present inventive concept may more enhance the quality of the substrate S where the high-k dielectric material is deposited on only the electrode layer.

Referring to FIGS. 1 to 4, the selective deposition step S30 injects a reactant gas onto the substrate S on which the selective adsorption step S20 has been performed, and thus, deposits the high-k dielectric layer onto only the electrode layer. The reactant gas may include a material which reacts with the high-k dielectric material adsorbed onto the electrode layer. For example, the reactant gas may be a reactant gas including ozone ($O_3$).

The selective deposition step S30 may be performed by injecting the reactant gas onto the substrate S through the second gas flow path 4*b* included in the injection unit 4. In the injection unit 4 illustrated in FIG. 2, the reactant gas may be injected toward the substrate S via the second gas holes 412 and the openings 421. In the injection unit 4 illustrated in FIG. 3, the reactant gas may be injected toward the substrate S via the second gas holes 412, the buffer space 43, and the second openings 423.

Referring to FIGS. 1 to 5, the method of processing a substrate according to the present inventive concept may include a purge step S40.

The purge step S40 injects a purge gas onto the substrate S. A gas, which remains without being adsorbed or deposited on the substrate S, may be purged through the purge step S40. The purge step S40 may inject an inert gas, such as argon (Ar) or nitrogen ($N_2$), as the purge gas onto the substrate S.

The purge step S40 may be performed after the selective adsorption step S20 is performed. In this case, the purge step S40 may inject the purge gas onto the substrate S on which the selective adsorption step S20 has been performed. Accordingly, a source gas which remains without being adsorbed onto the substrate S may be purged.

The purge step S40 may be implemented to control a timing for injecting the purge gas and thus allow niobium (Nb) to be more smoothly adsorbed on only the electrode layer. In this case, the purge step S40 may inject the purge gas onto the substrate S before an adsorption time, for which niobium (Nb) is adsorbed onto the insulation layer, elapses from a time at which the source gas including niobium oxide is injected through the selective adsorption step S20. Therefore, the purge step S40 may purge niobium (Nb) before niobium (Nb) is adsorbed onto the insulation layer, and thus, may prevent niobium (Nb) from being adsorbed onto the insulation layer. In this case, the purge step S40 may inject the purge gas onto the substrate S after an adsorption time, for which niobium (Nb) is adsorbed onto the electrode layer, elapses from a time at which the source gas including niobium oxide is injected through the selective adsorption step S20. Accordingly, the purge step S40 may control a timing for injecting the purge gas, and thus, may allow niobium (Nb) not to be adsorbed onto the insulation layer and simultaneously may allow niobium (Nb) to be adsorbed onto the electrode layer. Therefor, the method of processing a substrate according to the present inventive concept may more enhance the quality of the substrate S where niobium (Nb) is deposited on only the electrode layer.

The purge step S40 may be performed after at least one of the plasma treatment step S10, the selective adsorption step S20, and the selective deposition step S30 is performed. In this case, the purge step S40 may include a first purge step S41 of injecting the purge gas onto the substrate S after the selective adsorption step S20 is performed. After the first purge step S41 is performed, the selective deposition step S30 may be performed. The purge step S40 may include a second purge step S42 of injecting the purge gas onto the substrate S after the selective deposition step S30 is performed. After the second purge step S42 is performed, the steps may be performed again from the plasma treatment step S10. The purge step S40 may include a third purge step S43 of injecting the purge gas onto the substrate S after the plasma treatment step S10 is performed. After the third purge step S43 is performed, the selective adsorption step S20 may be performed. The method of processing a substrate according to the present inventive concept may include at least one of the first purge step S41, the second purge step S42, and the third purge step S43.

Referring to FIGS. 1 to 5, the method of processing a substrate according to the present inventive concept may include a surface treatment step S50.

The surface treatment step S50 performs surface treatment on the substrate S. The surface treatment step S50 may be performed before the plasma treatment step S10 is performed. The surface treatment step S50 may perform surface treatment on the substrate S through OEC, and thus, may remove impurities from at least one of the insulation layer and the electrode layer. In this case, the surface treatment step S50 may be performed by a substrate processing apparatus 1, which performs surface treatment by using OEC, of the substrate processing apparatuses 1 included in the substrate processing system.

The plasma treatment step S10 may be performed after the surface treatment step S50 is performed. Accordingly, the method of processing a substrate according to the present inventive concept may realize a selectivity of a high-k dielectric material corresponding to the electrode layer and the insulation layer, through surface treatment based on OEC and in-cycle plasma treatment using ICP. In this case, the surface treatment step S50 and the plasma treatment step S10 may be implemented as a selectivity formation step.

The present inventive concept described above are not limited to the above-described embodiments and the accompanying drawings and those skilled in the art will clearly appreciate that various modifications, deformations, and substitutions are possible without departing from the scope and spirit of the inventive concept.

The invention claimed is:

1. A method of processing a substrate where an insulation layer and an electrode layer are formed, the method comprising:

- a plasma treatment step of performing plasma treatment on the substrate by using a processing gas including fluorine (F);
- a selective adsorption step of injecting a source gas including a high-k dielectric material onto the substrate on which the plasma treatment step has been performed; and a selective deposition step of injecting a reactant gas onto the substrate, on which the selective adsorption step has been performed, to deposit a high-k dielectric layer onto only the electrode layer, wherein the plasma treatment step performs plasma treatment on the substrate, where the insulation layer manufactured by using silicon nitride (SiN) and the electrode layer manufactured by using titanium nitride (TiN) are formed, by using the processing gas including sulfur hexafluoride ($SF_6$).

2. The method of claim 1, wherein the plasma treatment step performs plasma treatment on the substrate by using the processing gas including sulfur hexafluoride ($SF_6$) to form a blocking layer, blocking adsorption of the high-k dielectric material, on the insulation layer.

3. The method of claim 1, wherein the selective adsorption step injects the source gas capable of forming niobium oxide.

4. The method of claim 1, wherein the selective adsorption step injects the source gas capable of forming niobium monoxide (NbO).

5. The method of claim 3, wherein the selective adsorption step injects the source gas including niobium oxide for an injection time, wherein the injection time is longer than a first adsorption time for which niobium is adsorbed onto the electrode layer, and wherein the injection time is shorter than a second adsorption time for which niobium is adsorbed onto the insulation layer.

6. The method of claim 3, comprising a purge step of injecting a purge gas onto the substrate on which the selective adsorption step has been performed, wherein the purge step injects the purge gas onto the substrate before an adsorption time, for which niobium is adsorbed onto the insulation layer, elapses from a time at which the source gas including niobium oxide is injected through the selective adsorption step.

7. The method of claim 3, wherein the selective deposition step injects the reactant gas including ozone ($O_3$).

8. The method of claim 1, comprising a purge step of injecting a purge gas onto the substrate, wherein the purge step is performed after at least one of the plasma treatment step, the selective adsorption step, and the selective deposition step is performed.

9. The method of claim 1, comprising a surface treatment step of performing surface treatment on the substrate before the plasma treatment step is performed.

10. A method of processing a substrate where an insulation layer and an electrode layer are formed, the method comprising:

a plasma treatment step of performing plasma treatment on the substrate by using a processing gas including fluorine (F);

a selective adsorption step of injecting a source gas including a high-k dielectric material onto the substrate on which the plasma treatment step has been performed; and a selective deposition step of injecting a reactant gas onto the substrate, on which the selective adsorption step has been performed, to deposit a high-k dielectric layer onto only the electrode layer, wherein the plasma treatment step performs plasma treatment on the substrate by using the processing gas including sulfur hexafluoride ($SF_6$) to form a blocking layer, blocking adsorption of the high-k dielectric material, on the insulation layer.

11. The method of one of claim 10, wherein the selective adsorption step injects the source gas capable of forming niobium oxide.

12. The method of one of claim 10, wherein the selective adsorption step injects the source gas capable of forming niobium monoxide (NbO).

13. The method of claim 11, wherein the selective adsorption step injects the source gas including niobium oxide for an injection time, wherein the injection time is longer than a first adsorption time for which niobium is adsorbed onto the electrode layer, and wherein the injection time is shorter than a second adsorption time for which niobium is adsorbed onto the insulation layer.

14. The method of claim 11, comprising a purge step of injecting a purge gas onto the substrate on which the selective adsorption step has been performed, wherein the purge step injects the purge gas onto the substrate before an adsorption time, for which niobium is adsorbed onto the insulation layer, elapses from a time at which the source gas including niobium oxide is injected through the selective adsorption step.

15. The method of claim 11, wherein the selective deposition step injects the reactant gas including ozone ($O_3$).

16. The method of claim 10, comprising a purge step of injecting a purge gas onto the substrate, wherein the purge step is performed after at least one of the plasma treatment step, the selective adsorption step, and the selective deposition step is performed.

17. The method of claim 10, comprising a surface treatment step of performing surface treatment on the substrate before the plasma treatment step is performed.

* * * * *